(12) United States Patent
Pei (10) Patent No.: US 8,545,630 B2
(45) Date of Patent: *Oct. 1, 2013

(54) COATING APPARATUS

(75) Inventor: Shao-Kai Pei, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 790 days.

This patent is subject to a terminal disclaimer.

(21) Appl. No.: 12/732,200

(22) Filed: Mar. 26, 2010

(65) Prior Publication Data

US 2010/0275838 A1    Nov. 4, 2010

(30) Foreign Application Priority Data

May 4, 2009    (CN) .......................... 2009 1 0302090

(51) Int. Cl.
*C23C 16/00*    (2006.01)

(52) U.S. Cl.
USPC ...... 118/719; 118/730; 118/500; 204/298.33; 204/298.27

(58) Field of Classification Search
USPC ........................................................ 118/719
See application file for complete search history.

(56) References Cited

U.S. PATENT DOCUMENTS

| 5,441,804 A | 8/1995 | Akitake et al. |
| 5,667,592 A * | 9/1997 | Boitnott et al. ............... 118/719 |
| 6,382,895 B1 * | 5/2002 | Konishi et al. ................ 414/217 |
| 8,430,964 B2 * | 4/2013 | Pei ............................... 118/719 |

FOREIGN PATENT DOCUMENTS

JP    10-204629    8/1998

* cited by examiner

*Primary Examiner* — Karla Moore
(74) *Attorney, Agent, or Firm* — Altis & Wispro Law Group, Inc.

(57) ABSTRACT

A coating apparatus includes a chamber device and a transporting device. The chamber device defines two coating chambers, two parallel coating channels, and a transportation channel communicating with the coating channels. The coating chambers are separated from each other. The coating chambers and the coating channels are alternately arranged. Each coating chamber defines at least one coating slot communicating with the respective coating channel. The transporting device includes a shaft rotatable with respect to the chamber device and a carrying board fixed on the shaft. The shaft is axially movable in the transportation channel. The carrying board is receivable in each of the coating channels for exposing a substrate to the corresponding coating chamber via the associated coating slot. The carrying board is rotatable about the shaft in each of the coating channels and jointly movable with the shaft in and along the transportation channel between the coating channels.

16 Claims, 7 Drawing Sheets

COATING APPARATUS

BACKGROUND

1. Technical Field

The present disclosure relates to coating apparatuses, and particularly relates to a coating apparatus for multi-layer coating.

2. Description of Related Art

It is common to use more than one kind of coating process, such as, spraying, ion sputtering, vapor deposition, or spray pyrolysis when applying multiple coats of materials such as paint or primer to a workpiece. Generally, each coating process must be carried out within a different vacuumized chamber of a machine capable of carrying out the desired coating process. To complete the coating process, the workpiece must be transported from one vacuum chamber to another vacuum chamber. However, during the transportation, the workpiece may be exposed to the environment and the workpiece may be contaminated.

Therefore, it is desirable to provide a coating apparatus, which can overcome the above-mentioned limitations.

DETAILED DESCRIPTION

Figure 1:
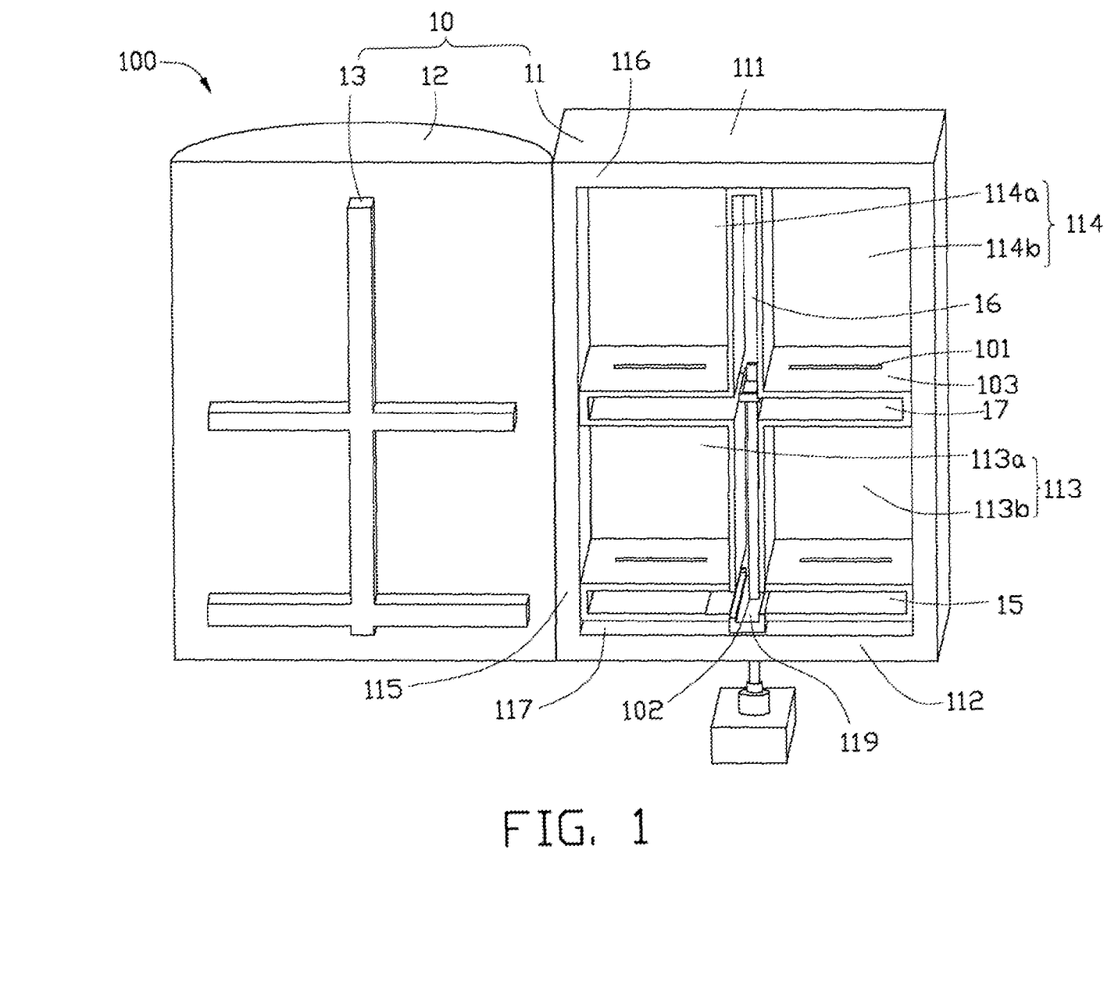
FIG. 1 is an isometric view of a coating apparatus, according to an exemplary embodiment.
Figure 2:
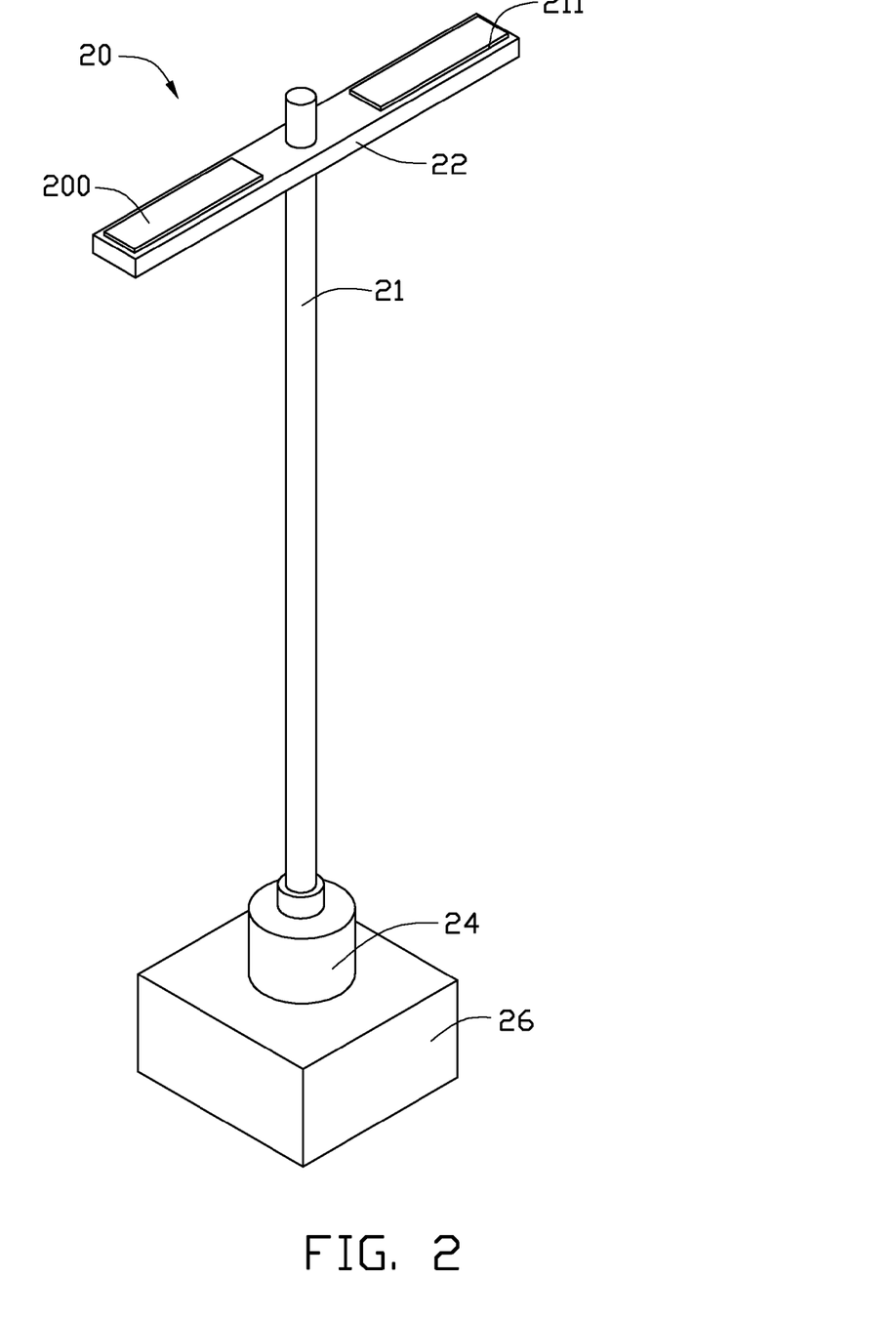
FIG. 2 is an isometric view of a transporting device of the coating apparatus of FIG. 1.
Figure 3:
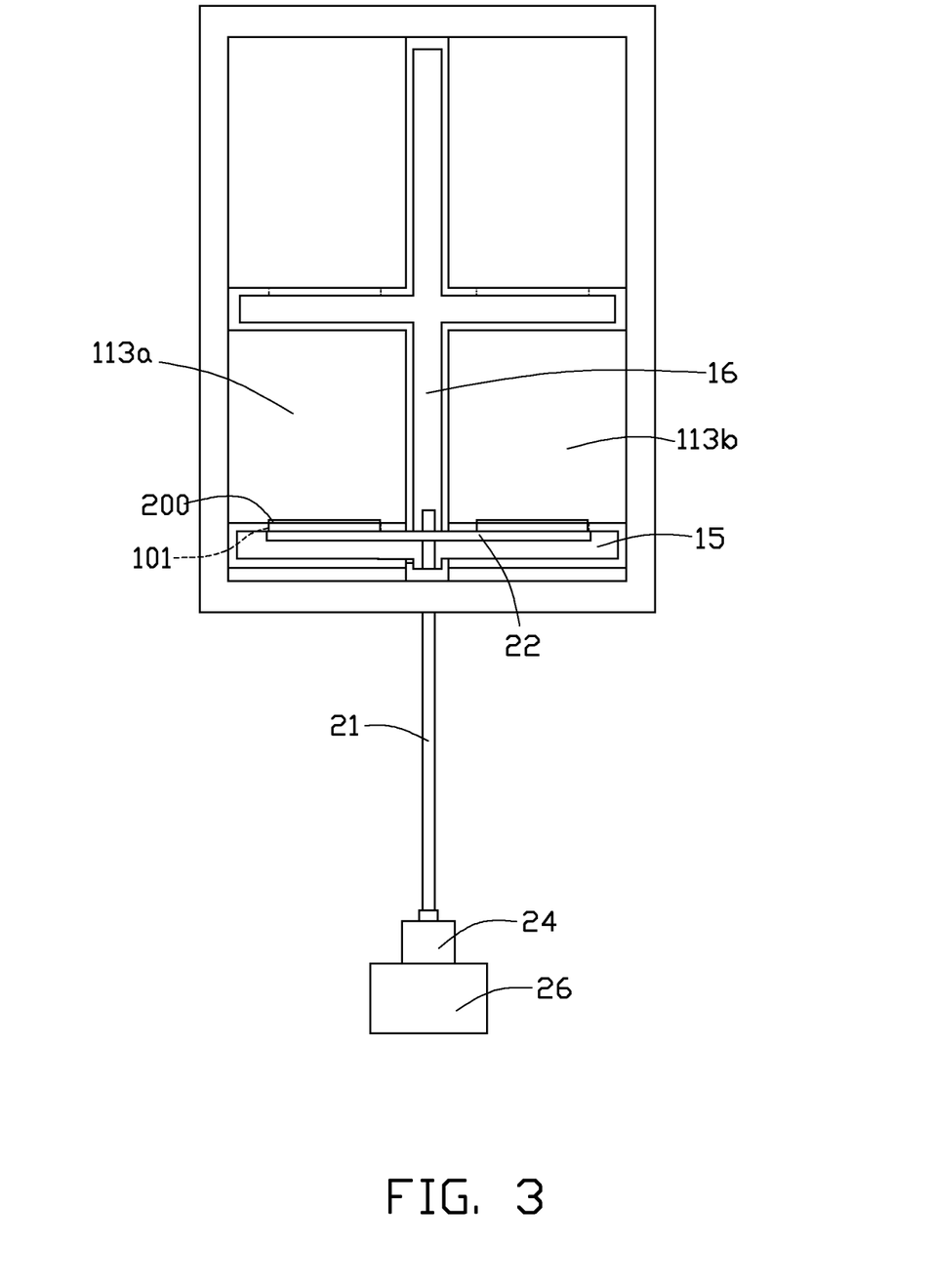
FIG. 3 is a front side view of the coating apparatus of FIG. 1 with the transporting device in a first state, but without a chamber door.
Figure 4:
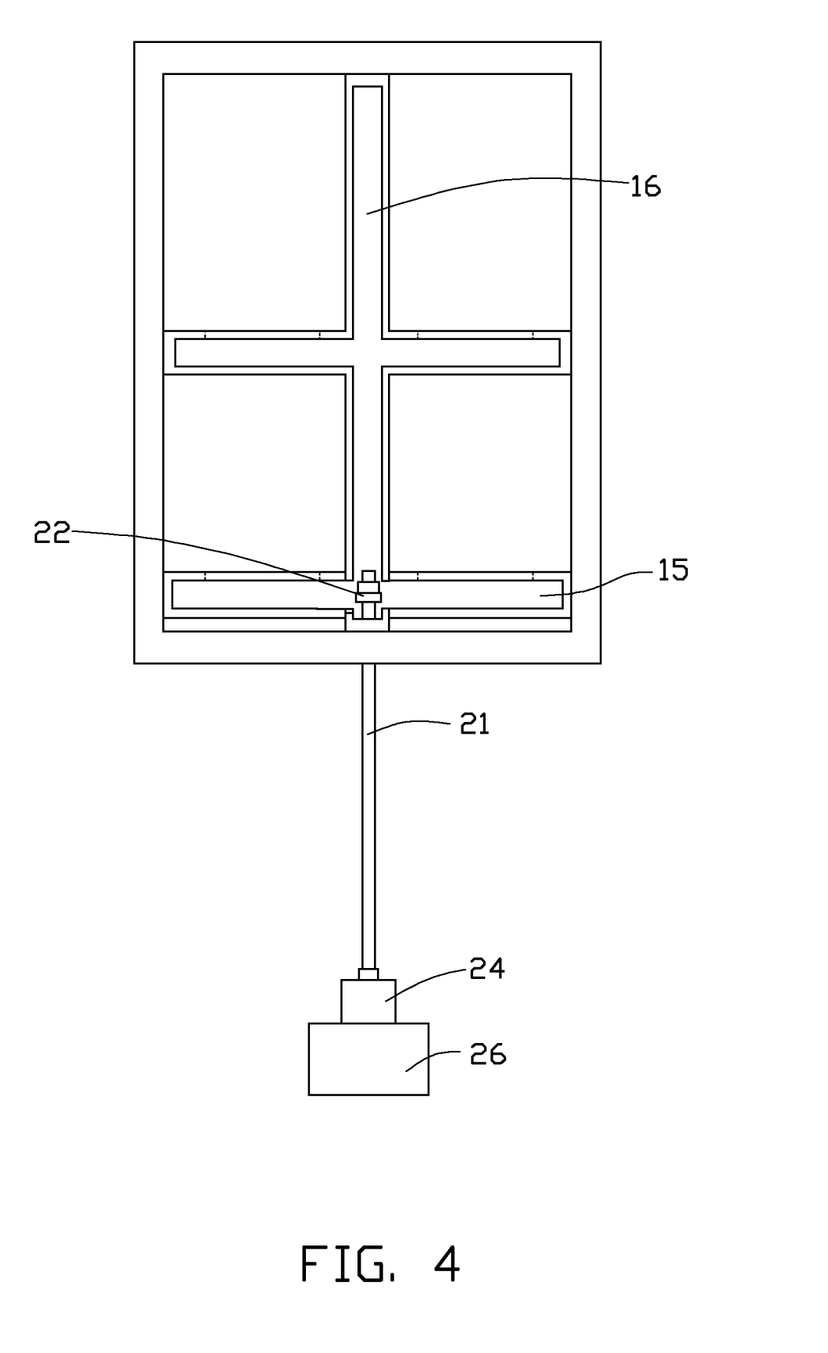
FIG. 4 is similar to FIG. 3, but showing the transporting device in a second state.
Figure 5:
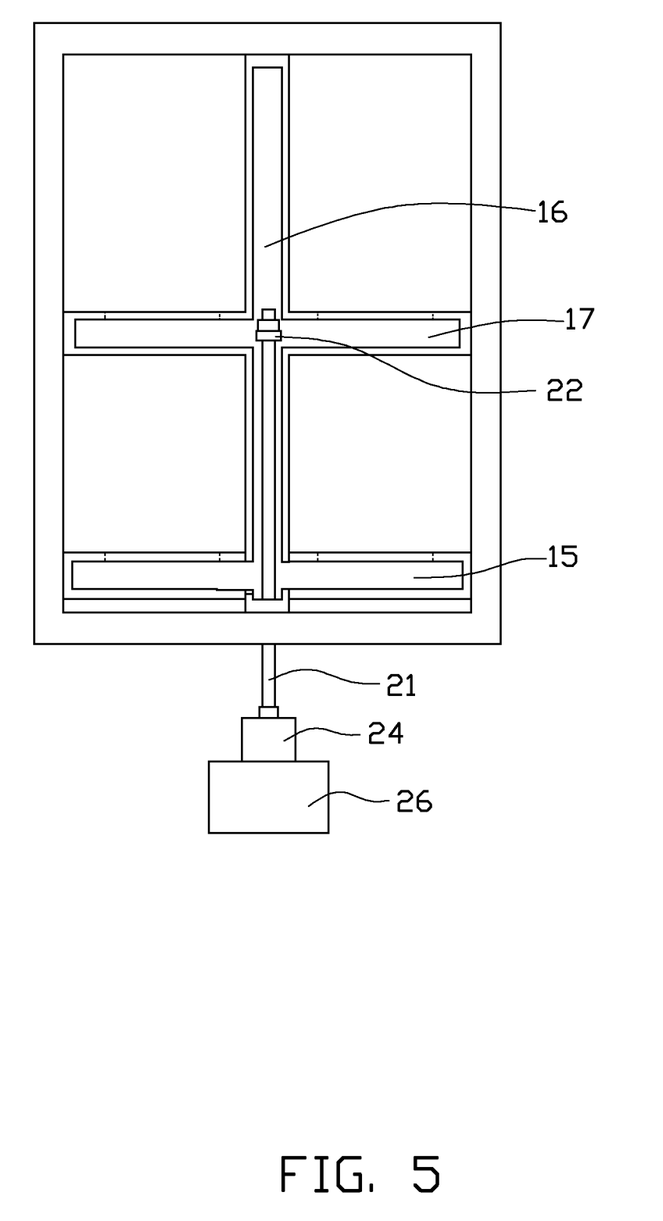
FIG. 5 is similar to FIG. 3, but showing the transporting device in a third state.
Figure 6:
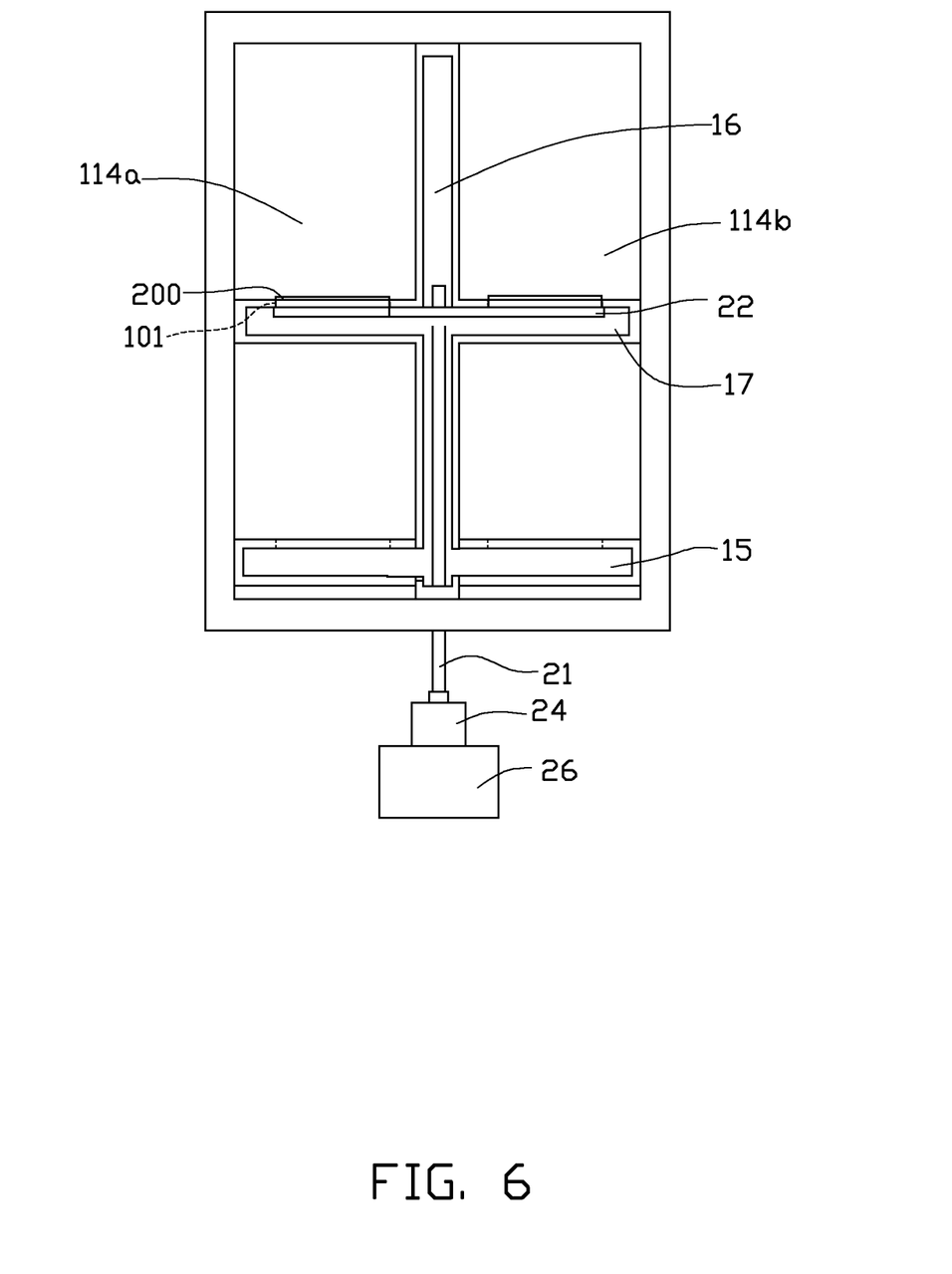
FIG. 6 is similar to FIG. 3, but showing the transporting device in a fourth state.

Referring to FIGS. 1 and 2, a coating apparatus 100 according to an exemplary embodiment is used to coat two substrates 200 at the same time. The coating apparatus 100 includes a chamber device 10 and a transporting device 20. The coating apparatus 100 is a multi-chambered apparatus for allowing the use of more than one kind of coating process without having to move workpieces out from one vacuum chamber to another.

The chamber device 10 includes a chamber body 11, a chamber door 12, a sealing element 13. The chamber body 11 is substantially rectangular-shaped and cooperates with the chamber door 12 (see below). The chamber body 11 includes a front surface 116 and defines a groove 117 in the front surface 116 mainly along the width and the height of the chamber body 11. The groove 117 defines a first coating chamber 113a, a second coating chamber 113b, a third coating chamber 114a, and a fourth coating chamber 114b separated from each other, generally at lower left, lower right, upper left, and upper right portions thereof respectively.

The first coating chamber 113a, the second coating chamber 113b, the third coating chamber 114a, and the fourth coating chamber 114b are substantially rectangular-shaped and are similar to each other in shape and size. The first coating chamber 113a, the second coating chamber 113b, the third coating chamber 114a, and the fourth coating chamber 114b extend along the width, the depth, of the height of the chamber body 11, thereby forming a left plate 115, a top plate 111, and a bottom plate 112 of the chamber body 11. Each of the coating chambers 113a, 113b, 114a and 114b defines a lower surface 103. The first coating chamber 113a and the second coating chamber 113b constitute a lower coating chamber section 113. The third coating chamber 114a and the fourth coating chamber 114b constitute an upper coating chamber section 114.

The chamber body 11 also defines a first coating channel 15, a second coating channel 17, and a transportation channel 16. The first coating channel 15 is beneath the lower coating chamber section 113. The second coating channel 17 interposes between the lower coating chamber section 113 and the upper coating chamber section 114. The first coating channel 15 and the second coating channel 17 are similar to each other in shape and size, and both mainly extend along the width and the depth of the chamber body 11. The transportation channel 16 interposes between the first coating chamber 113a and the second coating chamber 113b, and between the third coating chamber 114a and the fourth coating chamber 114b. The transportation channel 16 mainly extends along the width and the height of the chamber body 11. It intersects and communicates with the first coating channel 15 and the second coating channel 17. In this embodiment, the first coating channel 15 and the second coating channel 17 are parallel to each other, and the transportation channel 16 is substantially perpendicular to the two coating channels 15 and 17.

The first coating channel 15, the second coating channel 17, and the transportation channel 16 cooperatively define an opening 119. The chamber body 11 also defines four coating slots 101 in the four lower surfaces 103, respectively.

Two of the coating slots 101 communicate with first coating channel 15, the first coating chamber 113a, and the second coating chamber 113b respectively. The other two communicate with the second coating channel 17, the third coating chamber 114a, and the fourth coating chamber 114b respectively. The four coating slots 101 are positioned generally at the center of the four lower surfaces 103 respectively and extend along the width direction of the chamber body 11. The four coating slots 101 are shaped and sized corresponding to the substrates 200.

The chamber body 11 also defines a hole 102 through the bottom plate 112, generally at the center thereof, along the height direction of the chamber body 11. The through hole 102 communicates the transportation channel 16 with the external of the chamber body 11.

The chamber door 12 is substantially similar to the front surface 116 in shape and size. The chamber door 12 has one side hinged to the left plate 115. Therefore, the chamber door 12 can pivotally open and close to enclose the front surface 116 and the groove 117.

The sealing element 13 is set on the chamber door 12. The sealing element 13 is rectangular rod structure, shaped and sized to hermetically seal the opening 119. Thus, the first coating chamber 113a, the second coating chamber 113b, the third coating chamber 114a, and the fourth coating chamber 114b seal perfectly.

Referring to FIG. 2, the transportation device 20 includes a shaft 21, a carrying board 22, a motor 24, and a platform 26.

The carrying board 22 is shaped corresponding to but slightly smaller than the horizontal cross-section of the transportation channel 16. Thus, the carrying board 22 can freely move along the transportation channel 16. The carrying board 22 is rotatable about the shaft 21 in each of the coating channels 15 and 17, and jointly movable with the shaft 21 in and along the transportation channel 16 between the coating channels 15 and 17. The carrying board 22 defines two receiving grooves 211 in one surface thereof, for receiving the substrates 200 respectively. The receiving grooves 211 are symmetrically located at two sides of the carrying board 22 and correspond to the coating slots 101.

The shaft 21 is axially movable in the transportation channel 16. One end of the shaft 21 is fixed to the carrying board 22 and received in the first coating channel 15, the other end of the shaft 21 is fixed to the motor 24 and is external to the chamber device 10 via the through hole 102. The motor 24 is set in the platform 26 and drives the shaft 21 to rotate relative to the platform 26. The platform 26 is configured for raising or lowering the shaft 21.

Referring back to FIG. 1, in assembly, the carrying board 22 is received in the intersection of the first coating channel 15 and the transportation channel 16. The transportation device 20 is received in the transportation channel 16, and the shaft 21 protrudes outside from the chamber body 11 by extending through the hole 102 and is fixed to the platform 26 with the motor 24.

Referring to FIGS. 3, 4, 5, and 6, in operation, the two substrates 200 are placed in the receiving grooves 211 respectively. Then the chamber door 12 closes so that the opening 119 is sealed by the sealing element 13. The motor 24 rotates the carrying board 22 into the first coating channel 15, and the platform 26 drives the carrying board 22 to move along the shaft 21, so the substrates 200 are exposed to the first coating chamber 113a and the second coating chamber 113b via the coating slots 101 respectively. The transportation device 20 is in a first state (see FIG. 3). Consequently, a corresponding coating process carries out within the first coating chamber 113a and the second coating chamber 113b, respectively. The substrates 200 are thus coated with a layer (not shown).

When the coating process is finished, under the control of the motor 24 and the platform 26, the carrying board 22 rotates back to the transportation channel 16. The transportation device 20 is in a second state (see FIG. 4).

Under the control of the platform 26, the carrying board 22 is driven to the intersection of the transportation channel 16 and the second coating channel 17. The transportation device 20 is in a third state (see FIG. 5).

Under the control of the motor 24 and the platform 26, the carrying board 22 rotates in the second coating channel 17 and the substrates 200 are driven to be exposed to the coating chambers 114a and 114b via the coating slots 101 respectively. The transportation device 20 is in a fourth state (see FIG. 6). Another coating process carries out in the coating chambers 114a and 114b for coating another layer on the substrate 200. After the coating process finishes, under the control of the motor 24 and the platform 26, the carrying board 22 rotates and drives back to the third state, the second state, and the first state systematically. Then the carrying board 22 is driven to the first coating channel 15 (see FIG. 3).

It is noteworthy that the chamber device 10 is for providing at least two coating chambers, two coating channels, two coating slots, and a transportation channel. Wherein the coating chambers and the coating channels alternately arrange and communicate through the corresponding coating slots; and the transportation channel extends to intersect the coating chambers and the coating channels and communicates with the coating channels. Therefore, the chamber device 10 is not limited to the configuration of this embodiment. For example, more than two coating chambers can be deployed. For example, additional middle coating chamber section interposes between the lower coating chamber section and the upper coating chamber section can be deployed.

Also, more then one coating slot can be formed in one lower surface. As such, the carrying board defines more than two carrying grooves corresponding to the coating slots for coating more than two substrates at the same time. The first coating chamber 113a, the third coating chamber 114a, and left portions of the first coating channel 15 and the second coating channel 17 can be removed as well in other alternative embodiments, providing the coating efficiency is sufficient. The third coating chamber 114a, the fourth coating chamber 114b, the second coating channel 17, and top portion of the transportation channel 16 can be removed as well in other alternative embodiments, providing the coating efficiency is sufficient.

If the first coating chamber 113a, the second coating chamber 113b, the third coating chamber 114a, and the fourth coating chamber 114b directly define in the front surface 116, the sealing element 13 can be omitted.

The shaft 21, the motor 24, and the platform 26 constitute a driver to drive the carrying board 22 to move along the transportation channel 16 and to rotate the carrying board 22 into the coating channels 15 and 17. However, the driver is not limited to this embodiment but can be any other configuration equating thereto. For example, referring to FIG. 7, a coating apparatus 100a, according to another exemplary embodiment, is illustrated.

In order to present the hypothetical situations described above, referring to FIG. 7, a coating apparatus 100a, according to another exemplary embodiment, is illustrated. The difference between the two coating apparatuses 100 and 100a is the coating apparatus 100a include less coating chamber sections (it only includes one coating chamber section 113b). Also it drive the carrying board 22b another way (using another motor 50b which is set in a top plate 111a), a lifting bolt 80 which is fixed in a shaft 21a, and a cord 70 which is used for connecting a rotating shaft (unlabeled) of the motor 50b and the lifting bolt 80. The motor 50b drives the revolving shaft to wind or unwind the cord 70 therearound whereby the cord 70 pull the shaft 21 to move vertically.

Figure 7:
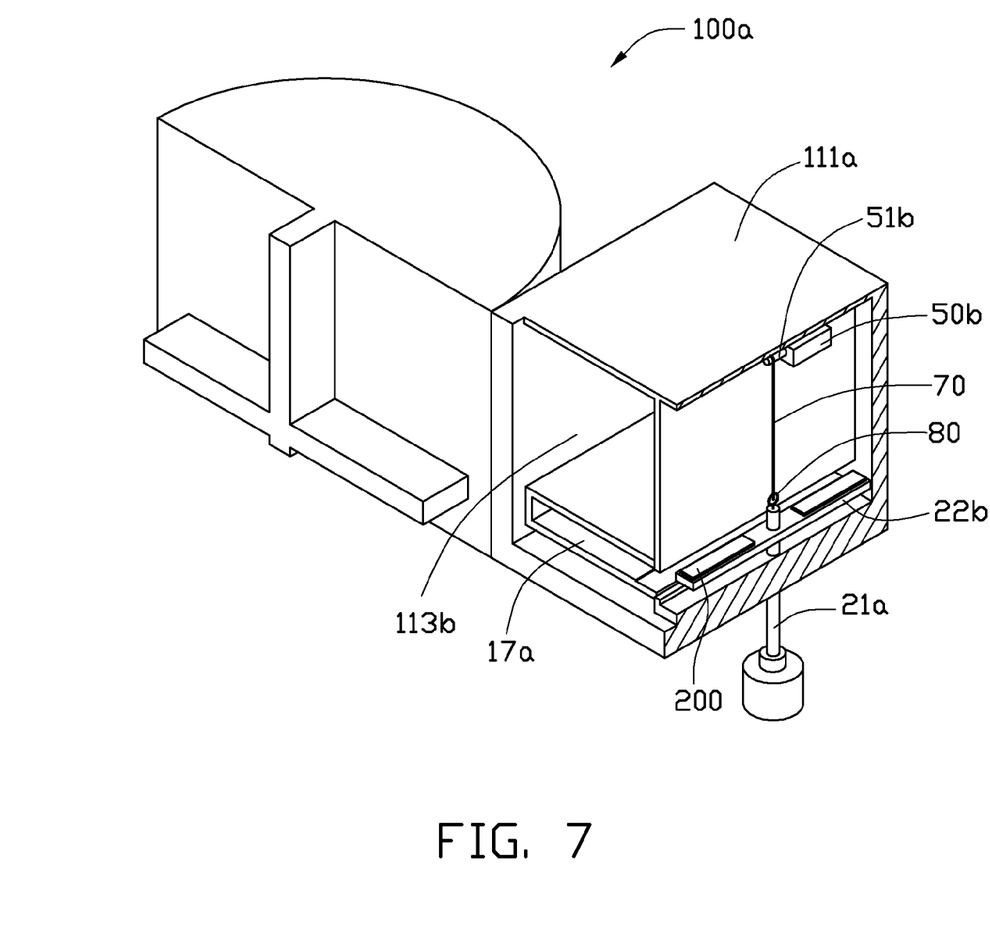
FIG. 7 is a partial, cross-sectional view of a coating apparatus, according to another exemplary embodiment.

The advantage of the coating apparatus 100a is similar with the coating apparatus 100, except that a number of layers coated on two substrates 200 layers is decreased.

It is to be understood, however, that even though numerous has been described with reference to particular embodiments, but the present disclosure is not limited to the particular embodiments described and exemplified, and the embodiments are capable of considerable variation and modification without departure from the scope of the appended claims.

What is claimed is:

1. A coating apparatus, comprising:
a chamber device comprising a chamber body and a chamber door;
the chamber body comprising a front surface, and two coating chambers, two parallel coating channels, and a transportation channel communicating with the coating channels all defined in the front surface, the coating chambers separated from each other, the coating chambers and the coating channels alternately arranged, each coating chamber defining at least one coating slot communicating with the respective coating channel; and
the chamber door being hinged to the chamber body to open or close the coating chambers, and being configured for covering the front surface; and
a transporting device comprising a shaft rotatable with respect to the chamber device and a carrying board fixed on the shaft, the shaft axially movable in the transportation channel, the carrying board receivable in each of the coating channels for exposing a substrate to the corresponding coating chamber via the associated coating slot, the carrying board rotatable about the shaft in each of the coating channels and jointly movable with the shaft in and along the transportation channel between the coating channels.

2. The coating apparatus of claim 1, wherein the coating channels and the transportation channel cooperatively define an opening in the front surface; and the chamber device further comprises a sealing element attached to the chamber door to hermetically seal the opening when the chamber door is closed.

3. The coating apparatus of claim 1, wherein the chamber device comprises a bottom plate having a hole defined therein, and the shaft extends through and is moveable along the hole.

4. The coating apparatus of claim 1, further comprising a motor to drive the shaft to rotate relative to the chamber device.

5. The coating apparatus of claim 4, further comprising a platform for bearing the motor and for raising or lowering the shaft.

6. The coating apparatus of claim 4, further comprising another motor to drive the shaft to move along the transportation channel.

7. The coating apparatus of claim 6, wherein the another motor is arranged above the shaft and includes a rotating shaft and a cord, the cord is interconnected between the rotating shaft and the shaft, and the another motor is configured to drive the rotating shaft to wind or unwind the cord therearound whereby the cord drives the shaft to move vertically along the transportation channel.

8. The coating apparatus of claim 1, wherein the carrying board defines at least one receiving groove for receiving the substrate.

9. The coating apparatus of claim 8, wherein the at least one receiving groove comprises two receiving grooves arranged at opposite sides of the center of the carrying board.

10. The coating apparatus of claim 8, wherein the at least one receiving groove comprises two receiving grooves arranged on the same side of the carrying board, and the at least one coating slot comprises two coating slots corresponding to the two receiving grooves.

11. The coating apparatus of claim 1, wherein the coating chambers are at opposite sides of the transportation channel.

12. The coating apparatus of claim 1, wherein the transportation channel is substantially perpendicular to the coating channels.

13. A coating apparatus, comprising:
  a chamber device comprising a chamber body and a chamber door;
  the chamber body comprising a front surface, and a first coating chamber, a second coating chamber separated from the first coating chamber, and a coating channel all defined in the front surface, the two coating chambers juxtaposed and above the coating channel, each coating chamber defining at least one coating slot communicating to the coating channel; and
  the chamber door being hinged to the chamber body to open or close the first and second coating chambers, and being configured for covering the front surface; and
  a transporting device comprising a shaft rotatable with respect to the chamber device and a carrying board fixed on the shaft, the shaft axially movable in the coating channel, the carrying board receivable in the coating channel for exposing a substrate to the corresponding chamber via the associated coating slot, the carrying board rotatable about the shaft in the coating channel and jointly movable with the shaft in and along the coating channel.

14. The coating apparatus of claim 13, wherein the carrying board defines at least one receiving groove for receiving the substrate.

15. The coating apparatus of claim 14, wherein the at least one receiving groove comprises two receiving grooves arranged at opposite sides of the center of the carrying board.

16. The coating apparatus of claim 14, wherein the at least one receiving groove comprises two receiving grooves arranged on the same side of the carrying board, and the at least one coating slot comprises two coating slots corresponding to the two receiving grooves.

* * * * *